(12) United States Patent
Li et al.

(10) Patent No.: US 11,368,013 B2
(45) Date of Patent: Jun. 21, 2022

(54) OVERCURRENT PROTECTION CIRCUIT AND METHOD THEREOF FOR USB WITH A POWER DELIVERY FUNCTION

(71) Applicant: Wistron Corp., New Taipei (TW)

(72) Inventors: Yong Bo Li, New Taipei (TW); Yong Qiang Li, New Taipei (TW); Wen Long Yang, New Taipei (TW); Jun Xin Qiu, New Taipei (TW)

(73) Assignee: Wistron Corp., New Taipei (TW)

( * ) Notice: Subject to any disclaimer, the term of this patent is extended or adjusted under 35 U.S.C. 154(b) by 255 days.

(21) Appl. No.: 16/282,198

(22) Filed: Feb. 21, 2019

(65) Prior Publication Data
US 2020/0059083 A1 Feb. 20, 2020

(30) Foreign Application Priority Data

Aug. 20, 2018 (CN) .......................... 201810947568.2

(51) Int. Cl.
*H02H 3/087* (2006.01)
*H03K 17/082* (2006.01)
(Continued)

(52) U.S. Cl.
CPC ......... *H02H 3/087* (2013.01); *H01L 27/0266* (2013.01); *H02H 3/093* (2013.01); *H03K 17/0822* (2013.01)

(58) Field of Classification Search
CPC .......... H02H 3/087; H02H 3/093; H02H 3/10; H02H 7/1213; H02H 3/08; H01L 27/0266; H03K 17/0822; H02J 9/00; G05F 1/613; H02M 1/08; H02M 1/083; H02M 1/36; H02M 2001/009; H02M 3/335–337; H02M 3/156–1588; H02M 3/4225; H02M 1/32
(Continued)

(56) References Cited

U.S. PATENT DOCUMENTS 5,570,277 A * 10/1996 Ito ........................... H02M 1/32
363/19
5,754,419 A * 5/1998 Ho ......................... H02M 3/158
363/89
(Continued)

FOREIGN PATENT DOCUMENTS

CN 105591538 A 5/2016
TW 201640803 A 11/2016

*Primary Examiner* — Thienvu V Tran
*Assistant Examiner* — Nusrat Quddus

(57) ABSTRACT

An overcurrent protection method is provided. The overcurrent protection method is applied to a USB with a PD function. The overcurrent protection method includes the steps of converting an input voltage into a first voltage to provide power to the first electronic device; determining whether the working current of the first electronic device is greater than a first default value; determining whether the working current of the first electronic device is greater than a second default value; in response to the working current being greater than the first default value, a first sensing signal is generated to disable a switch and to form an open circuit between the first electronic device and the second electronic device; and in response to the working current being greater than the second default value, conversion of the input voltage into the first voltage is stopped.

8 Claims, 7 Drawing Sheets

(51) Int. Cl.
  *H01L 27/02* (2006.01)
  *H02H 3/093* (2006.01)
(58) Field of Classification Search
  USPC ....... 323/272–289; 363/18–19, 21.01–21.18, 363/52–56, 125–127; 361/101
  See application file for complete search history.

(56) References Cited

U.S. PATENT DOCUMENTS

| | | | | |
|---|---|---|---|---|
| 6,335,577 B1* | 1/2002 | Baba | | H02H 3/087 307/64 |
| 6,611,132 B2* | 8/2003 | Nakagawa | | H02M 3/156 323/284 |
| 6,768,655 B1* | 7/2004 | Yang | | H02M 1/4225 363/21.01 |
| 6,882,513 B2* | 4/2005 | Laraia | | H01L 27/0285 361/84 |
| 7,355,830 B2* | 4/2008 | Motomori | | H02H 7/1213 361/93.1 |
| 8,193,779 B2* | 6/2012 | Ferguson | | H02J 7/045 320/163 |
| 8,456,096 B2* | 6/2013 | Kwok | | H05B 47/17 315/219 |
| 8,824,255 B2* | 9/2014 | Nagasato | | H02M 3/158 369/30.21 |
| 9,059,631 B2* | 6/2015 | Park | | H02M 3/158 |
| 9,178,415 B1* | 11/2015 | Kost | | H02M 1/32 |
| 9,906,143 B1* | 2/2018 | Yu | | H02H 7/1213 |
| 10,228,742 B2* | 3/2019 | Mattos | | G06F 13/385 |
| 10,491,128 B2* | 11/2019 | Arima | | H02M 1/14 |
| 10,601,317 B1* | 3/2020 | Song | | F21V 23/005 |
| 10,693,453 B1* | 6/2020 | Lee | | H03K 17/163 |
| 10,819,074 B2* | 10/2020 | Wu | | H02H 9/046 |
| 10,855,069 B2* | 12/2020 | Mukhopadhyay | | G06F 13/4081 |
| 10,950,987 B2* | 3/2021 | Bodnaruk | | G06F 13/4282 |
| 10,972,013 B2* | 4/2021 | Mizoe | | H02M 3/33523 |
| 2009/0180303 A1* | 7/2009 | Liu | | H02M 1/08 363/21.14 |
| 2010/0085675 A1* | 4/2010 | Oki | | H03K 17/162 361/101 |
| 2010/0148738 A1* | 6/2010 | Schiff | | H02M 3/157 323/282 |
| 2010/0164528 A1* | 7/2010 | Rahman | | G01R 35/005 324/762.01 |
| 2010/0225286 A1* | 9/2010 | Osaka | | H02M 3/156 323/272 |
| 2011/0018515 A1* | 1/2011 | McCloy-Stevens | | H02M 3/1588 323/284 |
| 2011/0141778 A1* | 6/2011 | Wu | | H02M 1/4225 363/95 |
| 2011/0148374 A1* | 6/2011 | Gizara | | H05B 45/3725 323/282 |
| 2011/0307910 A1* | 12/2011 | Nagasato | | H02M 1/32 720/695 |
| 2012/0062148 A1* | 3/2012 | Kim | | H05B 45/38 315/297 |
| 2013/0063116 A1* | 3/2013 | Sun | | H03K 17/302 323/284 |
| 2013/0200863 A1* | 8/2013 | Hung | | H02M 1/32 323/234 |
| 2013/0332750 A1* | 12/2013 | Souma | | H02H 3/087 713/300 |
| 2014/0266110 A1* | 9/2014 | Yuan | | H02M 3/156 323/282 |
| 2014/0360512 A1* | 12/2014 | Xiang | | H02J 7/0077 131/328 |
| 2015/0027466 A1* | 1/2015 | Xiang | | H02J 7/0013 131/329 |
| 2015/0244164 A1* | 8/2015 | Li | | H03K 17/0822 361/87 |
| 2015/0333502 A1* | 11/2015 | Prexl | | H02H 7/1213 361/18 |
| 2016/0094226 A1* | 3/2016 | Wang | | H03K 5/125 307/130 |
| 2016/0111868 A1* | 4/2016 | Kawata | | H02H 3/105 361/79 |
| 2016/0233659 A1* | 8/2016 | Barnette | | H02H 3/08 |
| 2016/0286620 A1* | 9/2016 | Zhang | | H05B 45/38 |
| 2017/0040792 A1* | 2/2017 | Li | | H02M 1/32 |
| 2017/0047731 A1* | 2/2017 | Manohar | | H02H 3/18 |
| 2017/0257031 A1* | 9/2017 | Shao | | H02M 3/1582 |
| 2017/0302172 A1* | 10/2017 | Peretz | | H02M 3/156 |
| 2017/0317583 A1* | 11/2017 | Forghani-Zadeh | | H03K 17/04206 |
| 2017/0331270 A1* | 11/2017 | Mattos | | G01R 19/165 |
| 2018/0013283 A1* | 1/2018 | Liu | | H02H 9/02 |
| 2018/0041111 A1* | 2/2018 | Chan | | H02M 1/32 |
| 2018/0341309 A1* | 11/2018 | Sporck | | G06F 13/4295 |
| 2019/0033953 A1* | 1/2019 | Kadgi | | G06F 13/385 |

\* cited by examiner

OVERCURRENT PROTECTION CIRCUIT AND METHOD THEREOF FOR USB WITH A POWER DELIVERY FUNCTION

CROSS REFERENCE TO RELATED APPLICATIONS

This Application claims priority of CN Patent Application No. 201810947568.2 filed on Aug. 20, 2018, the entirety of which is incorporated by reference herein.

BACKGROUND OF THE INVENTION

Field of the Invention

The invention generally relates to an overcurrent protection circuit and method. Description of the Related Art In order to make progress of the field of electronic device manufacturing, the requirements for the power transmission ability and the data transmission velocity of the transmission interface are being increased. In a universal serial bus (USB) with a power delivery (PD) function, the data transmission combined with the high-power power source makes the volume of the connector become smaller, and makes the use of the connector become more convenient. However, because the new transmission interface (i.e. the USB with a power delivery function) provides a charging function, the rush current may cause damage to the electronic device. Therefore, in order to prevent damage caused by the rush current and meet requirements for system compatibility, a protection mechanism needs to be established to ensure the safety of the electronic device.

BRIEF SUMMARY OF THE INVENTION

An embodiment of the invention provides an overcurrent protection method. The overcurrent protection method is applied to a USB with a power delivery (PD) function. The overcurrent protection method includes the steps of converting an input voltage into a first voltage to provide power to the first electronic device, wherein the input voltage is provided by a second electronic device; determining whether the working current of the first electronic device is greater than a first default value; determining whether the working current of the first electronic device is greater than a second default value, wherein the second default value is smaller than the first default value; in response to the working current being greater than the first default value, a first current detection circuit generates a first sensing signal to disable a switch and to form an open circuit between the first electronic device and the second electronic device; and in response to the working current being greater than the second default value, conversion of the input voltage into the first voltage is stopped.

An embodiment of the invention provides an overcurrent protection circuit. The overcurrent protection circuit is applied to a USB with a power delivery (PD) function. The overcurrent protection circuit includes a power receiving end, a power supply end, a switch and a first current detection circuit. The power receiving end is coupled to a first electronic device. The power supply end is coupled to a second electronic device and receives an input voltage from the second electronic device. The voltage conversion chip converts the input voltage into a first voltage to provide power to the first electronic device. The switch is coupled between the power receiving end and the voltage conversion chip. The first current detection circuit is coupled between the power receiving end and the switch to determine whether the working current of the first electronic device is greater than a first default value. In response to the working current being greater than the first default value, the first current detection circuit generates a first sensing signal to disable a switch. In response to the working current being greater than a second default value, the voltage conversion chip stops converting the input voltage into the first voltage, wherein the second default value is smaller than the first default value.

According to an embodiment of the invention, the overcurrent protection circuit further includes a second current detection circuit and a microcontroller. The second current detection circuit is coupled between the power receiving end and the switch to determine whether the working current of the first electronic device is greater than a third default value, wherein the third default value is smaller than the second default value. In response to the working current being greater than the third default value, the second current detection circuit generates a second sensing signal. The microcontroller is coupled to the second current detection circuit and the switch, and enables a timer when the microcontroller receives the second sensing signal. In response to the duration of the microcontroller receiving the second sensing signal being longer than a default time, the microcontroller disables the switch.

According to an embodiment of the invention, the switch includes a first MOSFET and a second MOSFET.

According to an embodiment of the invention, the first current detection circuit includes a first comparator and the second current detection circuit comprises a second comparator.

According to an embodiment of the invention, the first MOSFET includes a first gate, a first drain and a first source, and the second MOSFET includes a second gate, a second drain and a second source, wherein the first drain is coupled to an output end of a voltage conversion chip, the first source is coupled to the second source, and the first gate and the second gate are coupled to the first current detection circuit and the microcontroller.

Other aspects and features of the invention will become apparent to those with ordinary skill in the art upon review of the following descriptions of specific embodiments of overcurrent protection circuit and method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is some embodiments of the invention. This description is made for the purpose of illustrating the general principles of the invention and should not be taken in a limiting sense. The scope of the invention is determined by reference to the appended claims.

Figure 1:
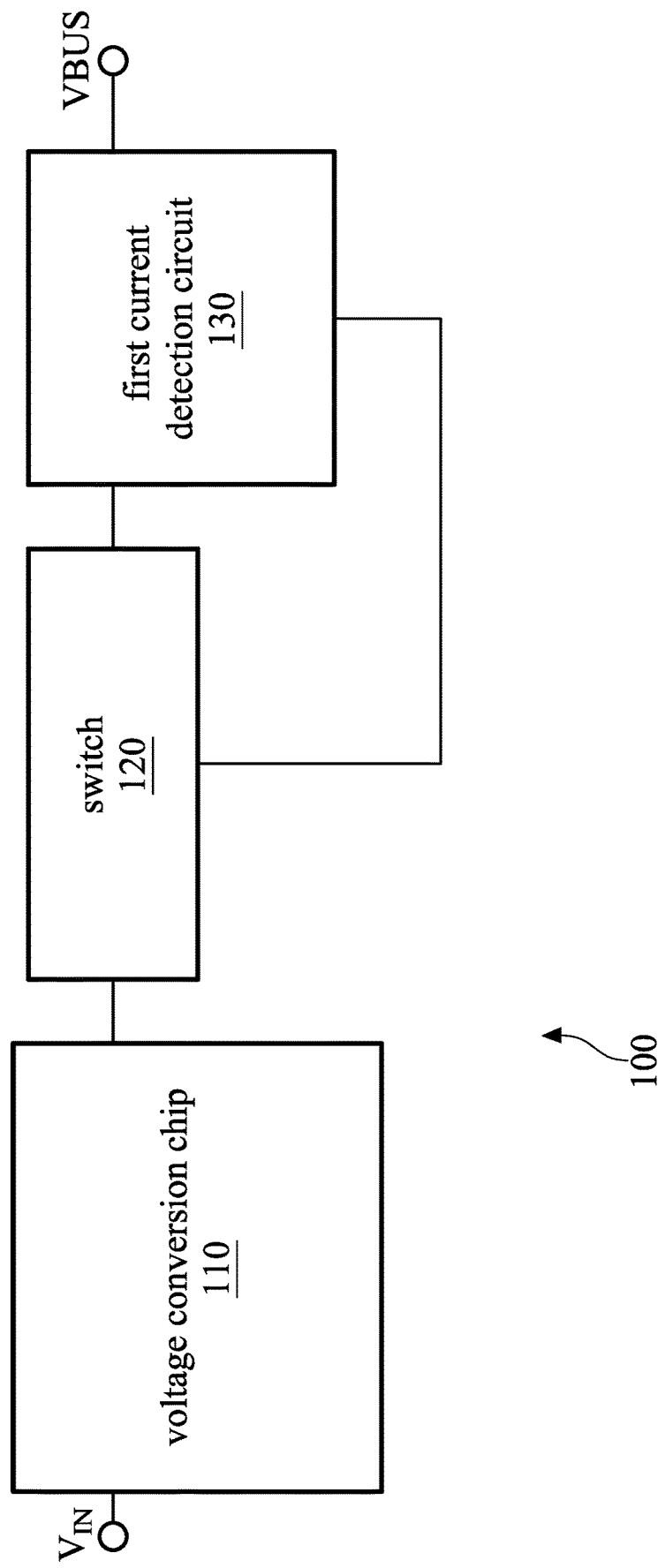
FIG. 1 is a block diagram of an overcurrent protection circuit according to an embodiment of the invention.

FIG. 1 is a block diagram of an overcurrent protection circuit according to an embodiment of the invention. In the embodiment, the overcurrent protection circuit 100 can be applied to a universal serial bus (USB) with a power delivery (PD) function (e.g. USB Type-C connector integrated with a power delivery function). As shown in FIG. 1, the overcurrent protection circuit 100 may include a power receiving end VBUS, a power supply end $V_{IN}$, a voltage conversion chip 110, a switch 120 and a first current detection circuit 130. Compared with a traditional USB, the USB with a power delivery function may provide better power transmission ability and higher data transmission velocity, wherein the voltage-current-index of the USB with a power delivery function may be increased to 20V/5A, i.e. the max power may reach 100 W. The power receiving end VBUS can also be regarded as a power consumption end, or a Sink, and it may be connected to an electronic device, e.g. a notebook or a mobile phone, but the invention should not be limited thereto. The power supply end $V_{IN}$ can also be regarded as a Source, and it is configured to be connected to a second electronic device, wherein the second electronic device is an electronic device with driving power function, e.g. the electronic device is connected to a supply mains, or the electronic device has a built-in battery. It should be noted that the notebook with the power supply function can also be regarded as the second electronic device to connect to the power supply end $V_{IN}$.

The voltage conversion chip 110 is configured to convert the input voltage (provided by the second electronic device) input from the power supply end $V_{IN}$ into a lower voltage (first voltage). Then, the lower voltage may be output from the power receiving end VBUS to provide power to the first electronic device connected to the power receiving end VBUS. For example, the second electronic device may be a display device, and the input voltage is provided by the power source of the display device. The switch 120 is coupled between the first current detection circuit 130 and the voltage conversion chip 110, and the switch 120 is controlled by the first current detection circuit 130. The first current detection circuit 130 is coupled between the power receiving end VBUS and the switch 120, and the first current detection circuit 130 is configured to determine whether the working current of the first electronic device connected to the power receiving end VBUS is greater than a first default value. Based on the first electronic device has a built-in battery, in response to the first electronic device turning on or the first electronic device being initially connected to the second electronic device, the working current of the first electronic device may flow to the second electronic device. In response to the working current flowing from the first electronic device to the second electronic device being greater than the first default value, the first current detection circuit 130 may generate a first sensing signal to close the switch 120, i.e. an open circuit may be generated between the power supply end $V_{IN}$ and the power receiving end VBUS to prevent the second electronic device from being influenced by an excessive working current. In some embodiments of the invention, the overcurrent protection circuit 100 including the power receiving end VBUS, the power supply end $V_{IN}$, the voltage conversion chip 110, the switch 120 and the first current detection circuit 130 may be integrated into the second electronic device.

In addition, the voltage conversion chip 110 may further include the overcurrent protection function. Based on the first electronic device has a built-in battery, when the first electronic device turns on or the first electronic device is initially connected to the second electronic device, in response to the working current flowing from the first electronic device to the second electronic device being greater than the second default value, the voltage conversion chip 110 may disable itself, i.e. the voltage conversion chip 110 may stop converting the input voltage to the supply voltage, and not provide power to the first electronic device. The first default value is greater than the second default value.

Figure 2:
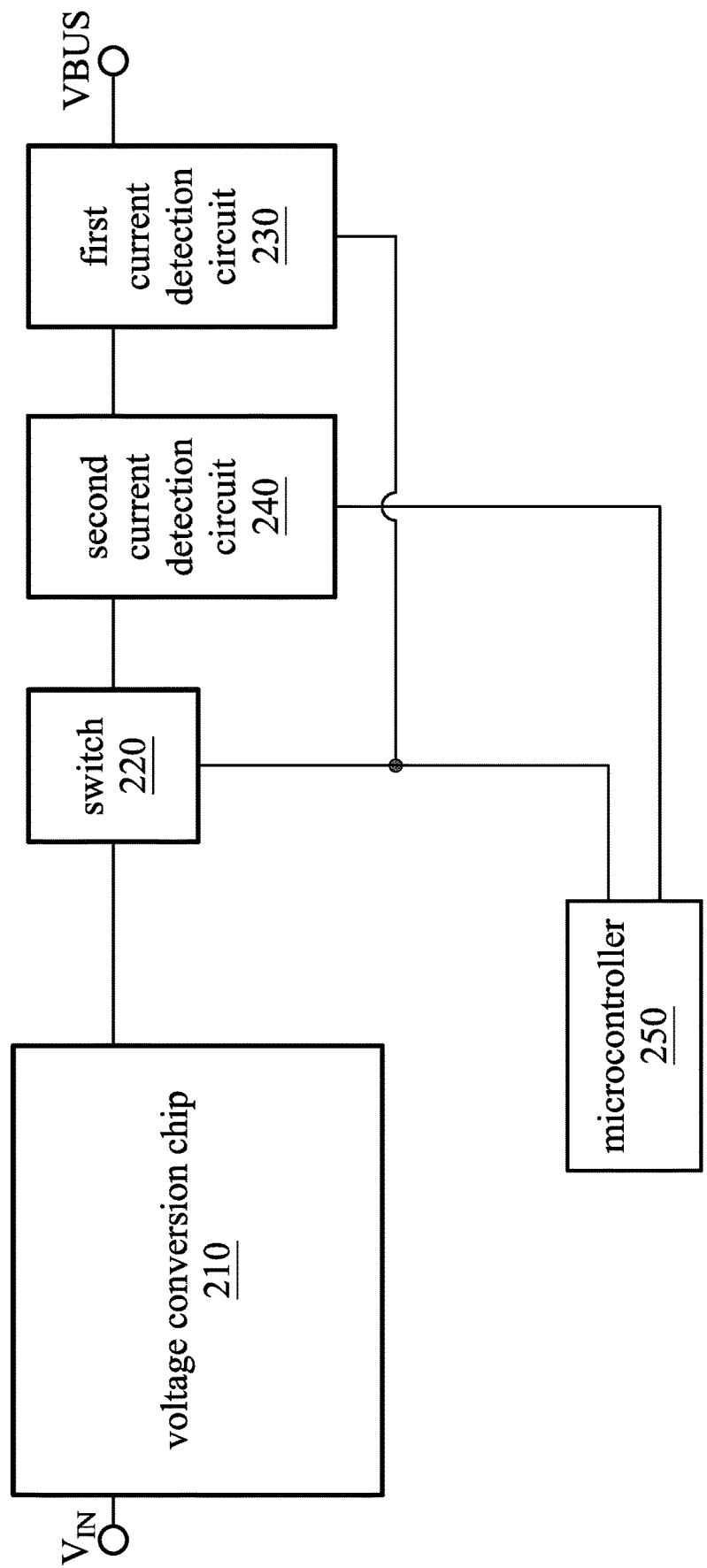
FIG. 2 is a block diagram of an overcurrent protection circuit according to another embodiment of the invention.

FIG. 2 is a block diagram of an overcurrent protection circuit according to another embodiment of the invention. As shown in FIG. 2, the overcurrent protection circuit 100 may include a power receiving end VBUS, a power supply end $V_{IN}$, a voltage conversion chip 210, a switch 220, a first current detection circuit 230, a second current detection circuit 240 and a microcontroller 250. The functions of the voltage conversion chip 210, the switch 220 and the first current detection circuit 230 are the same as the functions of the voltage conversion chip 110, the switch 120 and the first current detection circuit 130, therefore, details will not be illustrated more. The second current detection circuit 240 is coupled between the power receiving end VBUS and the switch 220 to determine whether the working current generated by the first electronic device connected to the power receiving end VBUS is greater than a third default value. The second default value is greater than the third default value. The microcontroller 250 may be configured in the second electronic device and have at least one timer. When the microcontroller 250 receives a second sensing signal output by the second current detection circuit 240, the timer is enabled. In an embodiment of the invention, the second electronic device may be a display device, and the microcontroller 250 may be a Scaler chip of the display device.

Based on the first electronic device has a built-in battery, when the first electronic device turns on or the first electronic device is initially connected to the second electronic device, if the working current of the first electronic device flowing to the second electronic device is greater than the third default value, the second electronic device may output the second sensing signal to the microcontroller 250. When the microcontroller 250 receives the second sensing signal, the microcontroller 250 may enable the built-in timer. In response to the duration of the microcontroller 250 receiving the second sensing signal being longer than a default time (e.g. 10 ms), the microcontroller 250 may output a close signal to the switch 220 to close the switch 220, i.e. an open circuit may be generated between the power supply end $V_{IN}$ and the power receiving end VBUS to prevent the second electronic device from being influenced by the inappropriate working current. It should be noted that in response to the microcontroller 250 no longer receiving the second sensing signal, the timer may return to zero. The timer may not be enabled until the microcontroller 250 receives the second sensing signal again. Furthermore, it should be noted that the default time should not be limited to the embodiment, and it can be set according to the requirements of the user.

Figure 3:
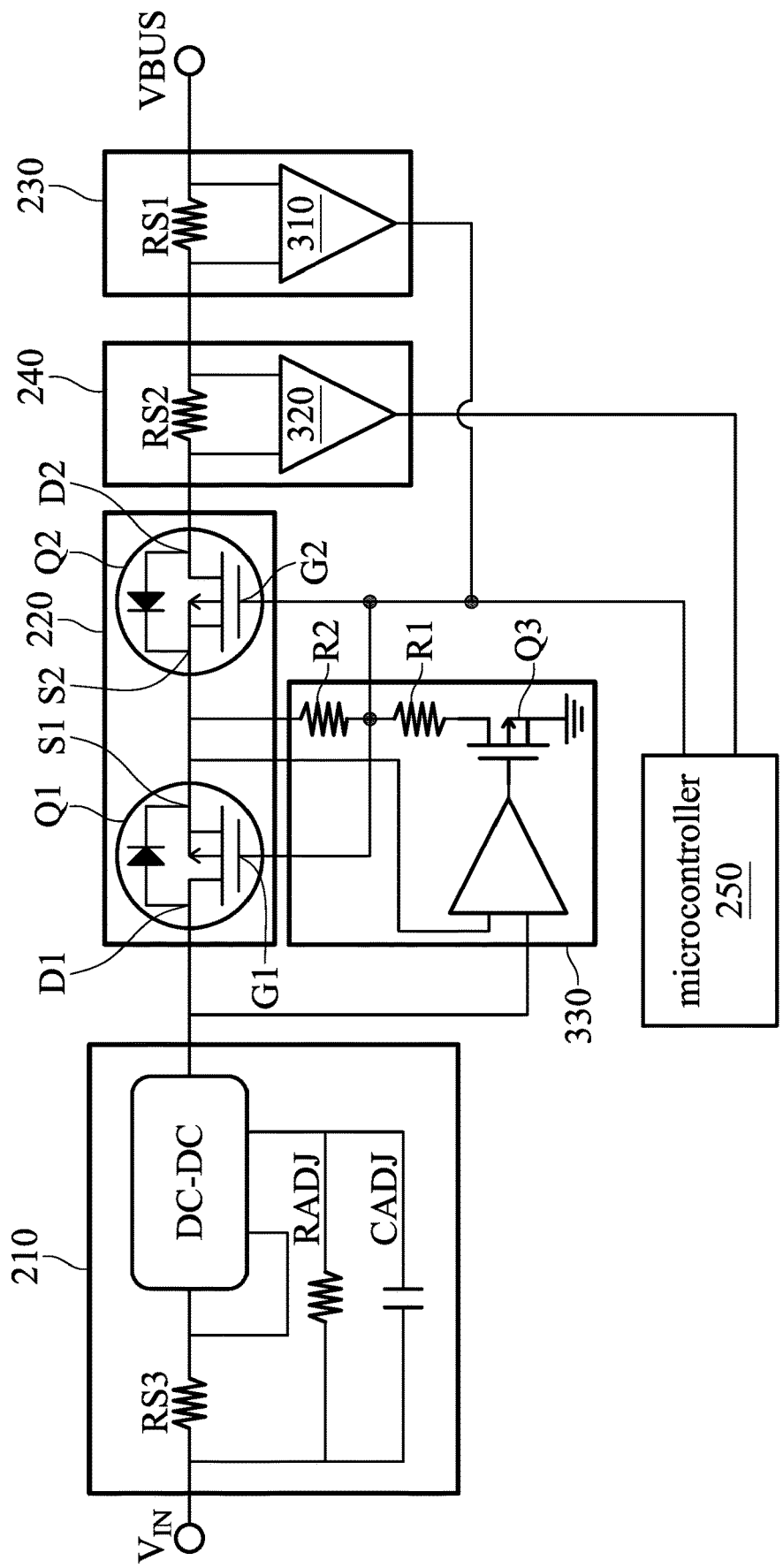
FIG. 3 is a circuit diagram of an overcurrent protection circuit applied to a USB Type-C connector according to an embodiment of the invention.
Figure 4A:
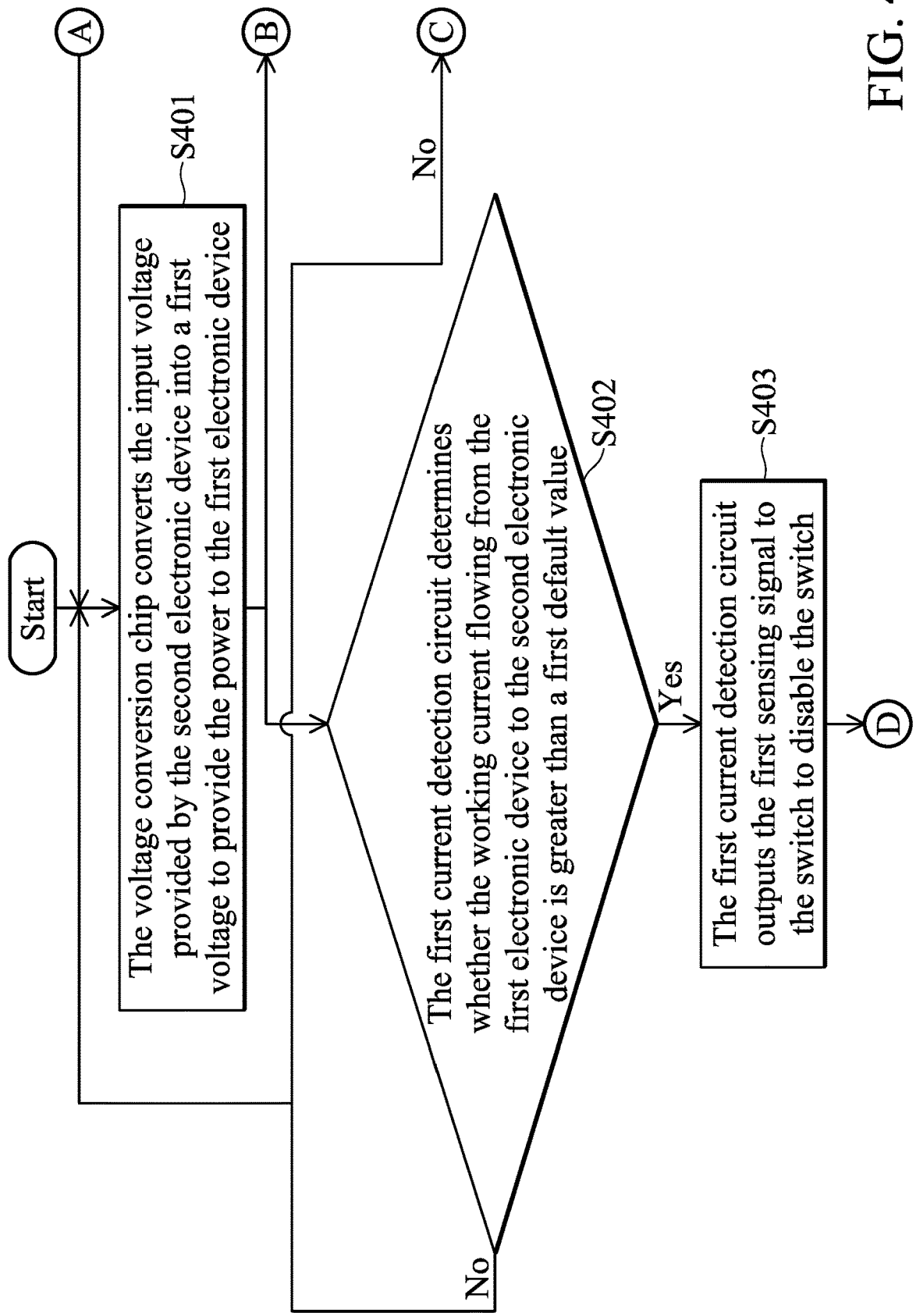
FIGS. 4A-4D is a flow chart illustrating an overcurrent protection method according to an embodiment of the invention.
Figure 4B:
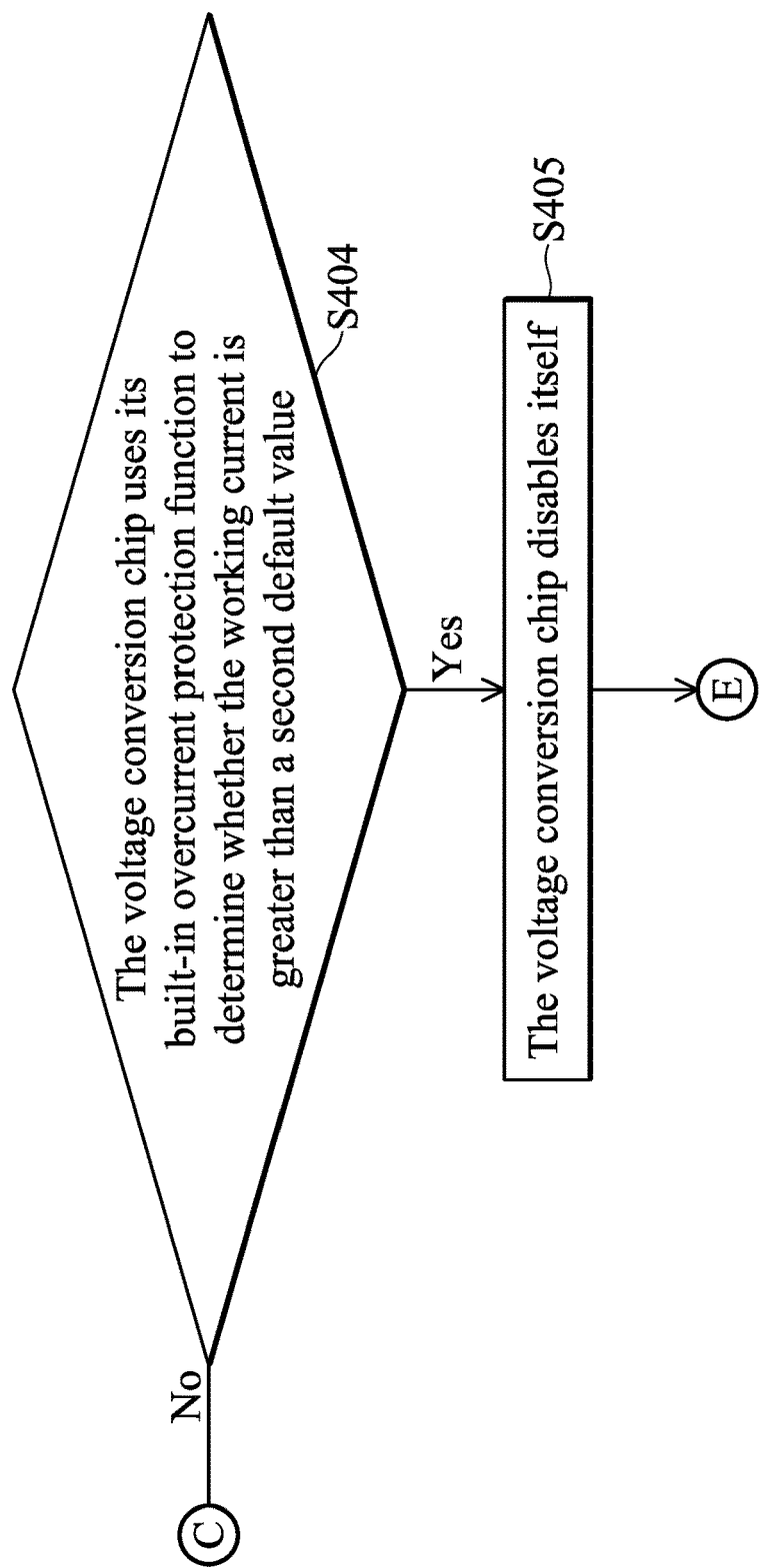
Figure 4C:
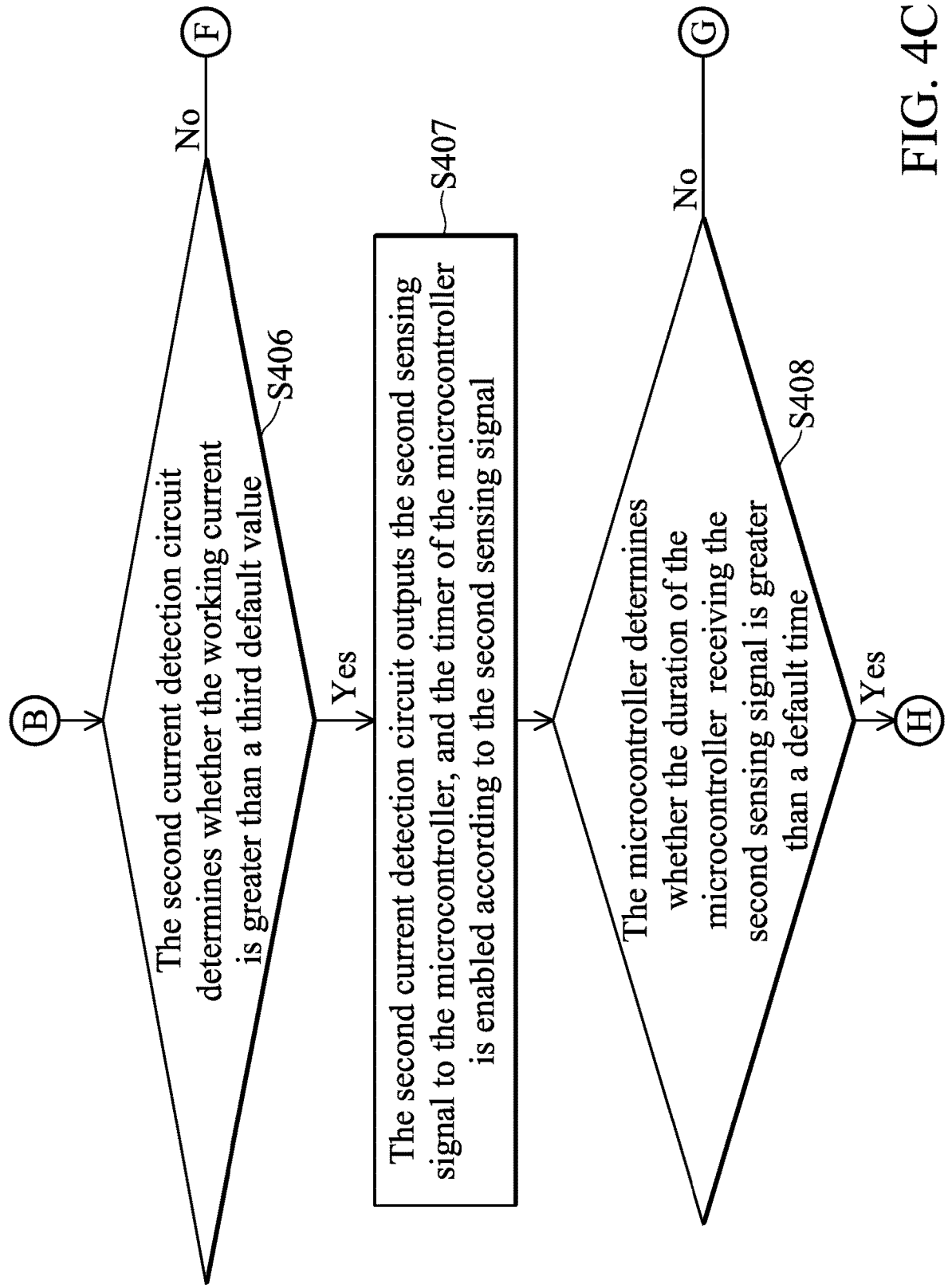
Figure 4D:
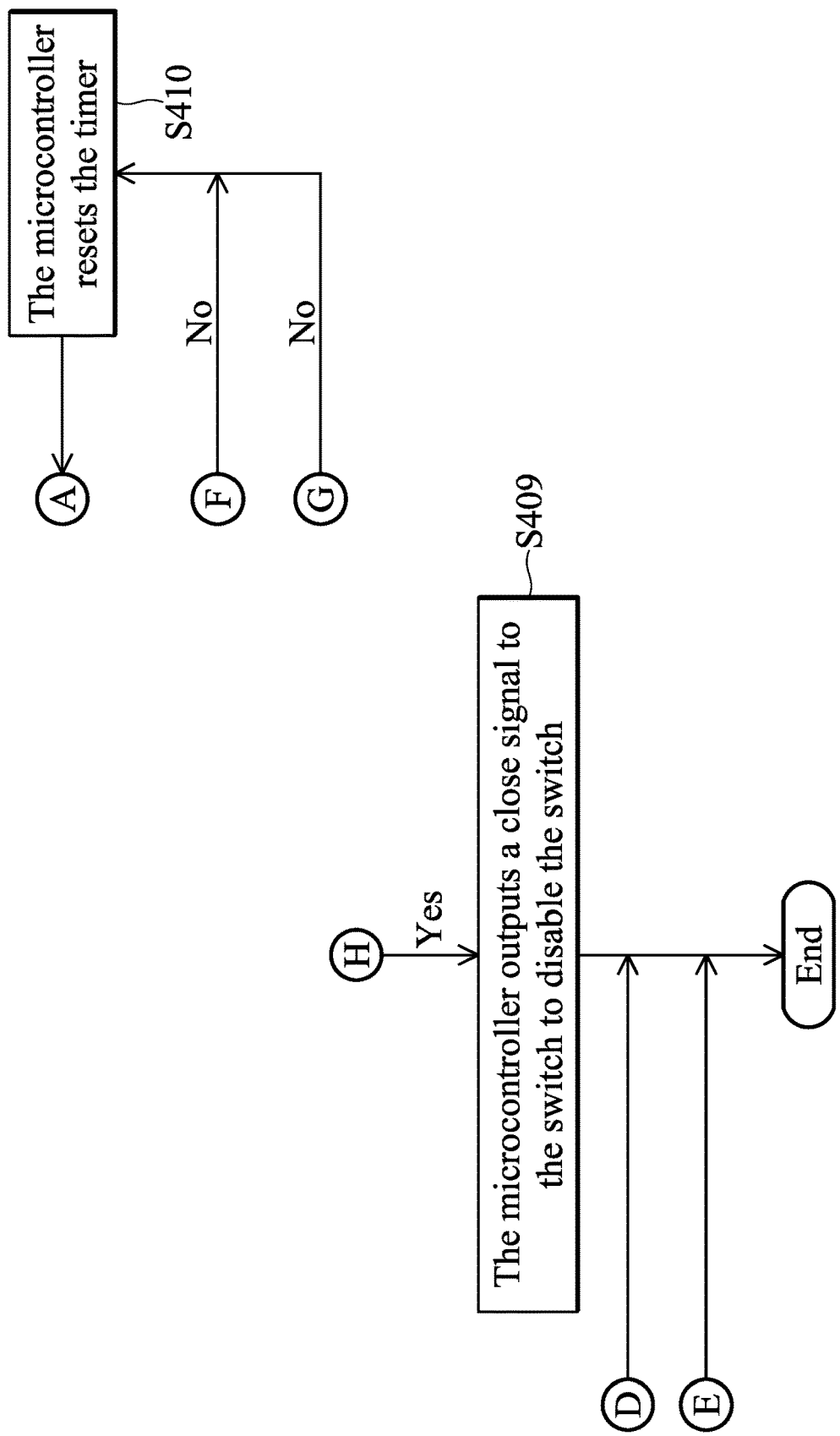

FIG. 3 is a circuit diagram of an overcurrent protection circuit applied to a USB Type-C connector according to an embodiment of the invention. As shown in FIG. 3, the voltage conversion chip 210 includes a DC/DC converter, a compensation circuit composed of a resistor RADJ and a capacitor CADJ, and a resistor RS3. In response to the working current flowing from the first electronic device to the second electronic device being greater than the second default value (e.g. the current of the first electronic device is greater than 130% normal working current), the voltage conversion chip 210 may stop converting the input voltage into the first voltage. The switch 220 may include a first transistor element and a second transistor element, wherein the first transistor element and the second transistor element are connected in series. In the embodiment, the switch 220 includes a first Metal-Oxide-Semiconductor Field-Effect Transistor (MOSFET) Q1 and a second MOSFET Q2. The first drain D1 of the first MOSFET Q1 is coupled to the output end of the voltage conversion chip 210, the first source S1 of the first MOSFET Q1 is coupled to the second source S2 of the second MOSFET Q2, and the second drain D2 of the second MOSFET Q2 is coupled to the first current detection circuit 230 and the second current detection circuit 240. The first current detection circuit 230 may include a first detection resistor RS1 and a first comparator 310. In response to the working current flowing from the first electronic device to the second electronic device being greater than the first default value (e.g. the current of the first electronic device is greater than 200% normal working current), the first comparator 310 may output a positive voltage level to the first gate G1 of the first MOSFET Q1 and the second gate G2 of the second MOSFET Q2 to form the open circuit for the first MOSFET Q1 and the second MOSFET Q2 to protect the second electronic device which is connected to the power supply end $V_{IN}$. The second current detection circuit 240 may include a second detection resistor RS2 and a second comparator 320. In response to the working current flowing from the first electronic device to the second electronic device being greater than the second default value (e.g. the current of the first electronic device is greater than 110% normal working current), the second current detection circuit 240 may output a positive voltage level or a negative voltage level to the microcontroller 250 to make the microcontroller 250 start to enable the timer according to the received positive voltage level or the negative voltage level. In response to the current of the first electronic device being greater than 110% normal working current, the microcontroller 250 may output the close signal with the positive voltage level to the first gate G1 of the first MOSFET Q1 and the second gate G2 of the second MOSFET Q2 to form the open circuit for the first MOSFET Q1 and the second MOSFET Q2. It should be noted that the switch 220 may also comprise one MOSFET, i.e. the switch 220 should not be limited to the structure of FIG. 3. In some embodiments, the first transistor element and the second transistor element of the switch 220 may form the open circuit according to the close signal with the negative voltage level. In addition, in some embodiments of the invention, when the overcurrent protection circuit is applied to a USB Type-C connector, the overcurrent protection circuit may further include a circuit 330. The circuit 330 may include a resistor R1, resistor R2, transistor element Q3 and a comparator. The main function of the circuit 300 is to prevent current reversal (refer to FIG. 3). It should be noted that the circuit 330 is optional. When the overcurrent protection circuit is applied to other USB connectors, the circuit 330 of FIG. 3 may be removed.

FIGS. 4A-4D is a flow chart illustrating an overcurrent protection method according to an embodiment of the invention. In step S401, the voltage conversion chip 210 converts the input voltage provided by the power supply module of the second electronic device into a first voltage to provide the power to the first electronic device. In step S402 the first current detection circuit 230 determines whether the working current flowing from the first electronic device to the second electronic device is greater than a first default value. In response to the working current being greater than the first default value, step 403 is performed. In step S403, the first current detection circuit 230 outputs the first sensing signal to the switch 220 to disable the switch 220 to form an open circuit between the power supply end $V_{IN}$ and the power receiving end VBUS thereby preventing the second electronic device from being influenced by an excessive working current. In step S404, the voltage conversion chip 210 uses its built-in overcurrent protection function to determine whether the working current flowing from the first electronic device to the second electronic device is greater than a second default value. In response to the working current being greater than the second default value, step 405 is performed. In step S405, the voltage conversion chip 210 may disable itself to protect the power supply module of the second electronic device. In step S406, the second current detection circuit 240 determines whether the working current flowing from the first electronic device to the second electronic device is greater than a third default value. In response to the working current is greater than the third default value, step 407 is performed. In step S407, the second current detection circuit 240 outputs the second sensing signal to the microcontroller 250, and the timer of the microcontroller 250 is enabled according to the second sensing signal. In step S408, the microcontroller 250 may determine whether the duration of the microcontroller 250 receiving the second sensing signal is greater than a default time. In some embodiments, the default time may be 10 ms, but the invention should not be limited thereto. In response to the duration of the microcontroller 250 receiving the second sensing signal is greater than the default time, step S409 is performed. In step S409, the microcontroller 250 outputs a close signal to the switch 220 to disable the switch 220 to form an open circuit between the power supply end $V_{IN}$ and the power receiving end VBUS to prevent the operation of the second electronic device from being influenced by the working current. Furthermore, in response to the duration of the microcontroller 250 receiving the second sensing signal being shorter than or equal to the default time, step S410 is performed. In step S410, the microcontroller 250 may reset the timer. The timer may not be enabled until the microcontroller 250 receives the second sensing signal again. In some embodiments, the first default value is greater than a second default value, and the second default value is greater than the third default value. For example, the first default value may be 200% normal working current, the second default value may be 130% normal working current and the third default value may be 110% normal working current, but the invention should not be limited thereto.

According to the overcurrent protection circuit and the method, the built-in overcurrent protection function of the voltage conversion chip and the multiple protection mechanisms of the current detection circuits may avoid that the working current from the power receiving end influences the electronic device in power supply end. Furthermore, the multiple protection mechanisms may increase the compatibility of the system to reduce the frequency of triggering the protection mechanism.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated. While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An overcurrent protection method, applied to a USB with a power delivery (PD) function, comprising:
converting, by a voltage conversion chip of a overcurrent protection circuit, an input voltage into a first voltage to provide power to a first electronic device, wherein the input voltage is provided by a second electronic device;
determining, by a first current detection circuit of the overcurrent protection circuit, whether a working current of the first electronic device is greater than a first default value;
determining, by the voltage conversion chip, whether the working current of the first electronic device is greater than a second default value, wherein the second default value is smaller than the first default value;
in response to the working current being greater than the first default value, generating, by the first current detection circuit, a first sensing signal to disable a switch to form an open circuit between the first electronic device and the second electronic device;
in response to the working current being greater than the second default value, stopping, by the voltage conversion chip, conversion of the input voltage into the first voltage;
determining, by a second current detection circuit, whether the working current of the first electronic device is greater than a third default value, wherein the third default value is smaller than the second default value;
in response to the working current being greater than the third default value, generating, by the second current detection circuit, a second sensing signal;
enabling, by a microcontroller, a timer when the second sensing signal output by the second current detection circuit is received by the microcontroller; and
in response to a duration of the microcontroller receiving the second sensing signal being longer than a default time, the microcontroller disables the switch.

2. The overcurrent protection method of claim 1, wherein the switch comprises a first MOSFET and a second MOSFET.

3. The overcurrent protection method of claim 2, wherein the first current detection circuit comprises a first comparator and the second current detection circuit comprises a second comparator.

4. The overcurrent protection method of claim 3, wherein the first MOSFET comprises a first gate, a first drain and a first source, and the second MOSFET comprises a second gate, a second drain and a second source, wherein the first drain is coupled to an output end of the voltage conversion chip, the first source is coupled to the second source, and the first gate and the second gate are coupled to the first current detection circuit and the microcontroller.

5. An overcurrent protection circuit, applied to a USB with a power delivery (PD) function, comprising:
a power receiving end, coupled to a first electronic device;
a power supply end, coupled to a second electronic device and receiving an input voltage from the second electronic device;
a voltage conversion chip, converting the input voltage into a first voltage to provide power to the first electronic device;
a switch, coupled between the power receiving end and the voltage conversion chip;
a first current detection circuit, coupled between the power receiving end and the switch to determine whether a working current of the first electronic device is greater than a first default value,
wherein in response to the working current being greater than the first default value, the first current detection circuit generates a first sensing signal to disable a switch;
wherein the voltage conversion chip determines whether the working current of the first electronic device is greater than a second default value; and
wherein in response to the working current being greater than the second default value, the voltage conversion chip stops converting the input voltage into the first voltage, wherein the second default value is smaller than the first default value;
a second current detection circuit, coupled between the power receiving end and the switch to determine whether the working current of the first electronic device is greater than a third default value, wherein the third default value is smaller than the second default value, and wherein in response to the working current being greater than the third default value, the second current detection circuit generates a second sensing signal; and
a microcontroller, coupled to the second current detection circuit and the switch, wherein the microcontroller enables a timer when the microcontroller receives the second sensing signal,
wherein in response to a duration of the microcontroller receiving the second sensing signal being greater than a default time, the microcontroller disables the switch.

6. The overcurrent protection circuit of claim 5, wherein the switch comprises a first MOSFET and a second MOSFET.

7. The overcurrent protection circuit of claim 6, wherein the first current detection circuit comprises a first comparator and the second current detection circuit comprises a second comparator.

8. The overcurrent protection circuit of claim 7, wherein the first MOSFET comprises a first gate, a first drain and a first source, and the second MOSFET comprises a second gate, a second drain and a second source, wherein the first drain is coupled to an output end of the voltage conversion chip, the first source is coupled to the second source, and the first gate and the second gate are coupled to the first current detection circuit and the microcontroller.

* * * * *